(12) United States Patent
Miyamoto

(10) Patent No.: US 6,224,736 B1
(45) Date of Patent: May 1, 2001

(54) APPARATUS AND METHOD FOR FORMING THIN FILM OF ZINC OXIDE

(75) Inventor: Yusuke Miyamoto, Kyotanabe (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/235,391

(22) Filed: Jan. 22, 1999

(30) Foreign Application Priority Data

Jan. 27, 1998 (JP) .................................................. 10-013821

(51) Int. Cl.[7] ....................................................... C25D 5/00
(52) U.S. Cl. .............................. 205/97; 205/82; 204/237; 204/239; 204/274; 204/242; 204/280; 204/289
(58) Field of Search .................................... 204/237, 239, 204/274, 242, 280, 289; 205/82, 97

(56) References Cited

U.S. PATENT DOCUMENTS 4,586,988    5/1986    Nath et al. ............................. 204/15

FOREIGN PATENT DOCUMENTS

| 0766322A2 | 4/1997 | (EP) . |
|---|---|---|
| 0794270A1 | 9/1997 | (EP) . |
| 8-217443 | 8/1996 | (JP) . |

OTHER PUBLICATIONS

Patent Abstracts of Japan, vol. 016, No. 351 (C–0968); Apr. 8, 1992, considered for abstract only.
Patent Abstracts of Japan, vol. 012, No. 040 (C–474), Aug. 18, 1987, considered for abstract only.
Inoue, Y., et al., "Optical confinement effect in a–SiGe solar cells on stainless steel substrates", Energy Conversion Lab, 29p–MF–2, p. 747, No date, Considered for brief explanation in specification only.

Sannomiya, H., et al., "a–SiC/a–Si/a–SiGe Multi–Bandgap Stacked Solar Cells with Bandgap Profiling", Tech. Digest of the Int'l. PVSEC–5, 1990, pp. 387–390, No month available.

Izaki, M., et al., "Electrolyte Optimization for Cathodic Growth of Zinc Oxide Films", 1996, J. Electrochem. Soc., vol. 143, pp. L53–55, No month available.

*Primary Examiner*—Kathryn Gorgos
*Assistant Examiner*—Christopher Keehan
(74) *Attorney, Agent, or Firm*—Fitzpatrick, Cella, Harper & Scinto

(57) ABSTRACT

The present invention provides an apparatus or a method for forming a thin zinc oxide film on a conductive base member by immersing the conductive base member and a counter electrode in an aqueous solution and supplying a current between the conductive base member and the counter electrode, in which (a) a distance between the counter electrode and the base member is 50 mm or more at an end portion of the counter electrode and is 3 mm to 40 mm at a central portion of the counter electrode, and (b) an end portion of the counter electrode is folded by an angle of $-1°$ to $-90°$ with respect to the conductive base member. Thus the thin zinc oxide film of satisfactory film quality can be formed on the conductive base member for a long time with a satisfactory yield, and inexpensive and stable production of the thin zinc oxide film can be realized.

26 Claims, 5 Drawing Sheets

APPARATUS AND METHOD FOR FORMING THIN FILM OF ZINC OXIDE

BACKGROUND OF THE INVENTION

1. Field of the Invention

The present invention relates to an apparatus and a method for forming a thin film of zinc oxide on a base member by electrodeposition, and more particularly to a thin zinc oxide film-forming apparatus and method in which a distance between a counter electrode and a base member is adjusted by improving the shape of the counter electrode, and a thin zinc oxide film forming apparatus and method in which replenishment of zinc ions is improved.

2. Related Background Art

The photovoltaic element composed of hydrogenated amorphous silicon, hydrogenated amorphous silicon germanium, hydrogenated amorphous silicon carbide or microcrystalline silicon has conventionally been provided with a back surface reflection layer in order to improve the light collecting efficiency in the long wavelength region. It is preferable that such back surface reflection layer shows effective reflection characteristics in a wavelength region close to the end of the band of a semiconductor material where its absorption becomes lower, namely in a range from 800 nm to 1200 nm. Such condition can be sufficiently satisfied by a metal layer such as of gold, silver, copper or aluminum.

There is also known so-called light confinement technology by providing a layer with surface irregularities which is optically transparent within a predetermined wavelength region. Such layer with surface irregularities is generally provided between the above-mentioned metal layer and a semiconductor layer to improve the short-circuit current density Jsc by effective utilization of the reflection layer. Also for preventing the deterioration of the characteristics by a shunt path, it is known to provide a conductive layer of a light-transmissive material, namely a transparent conductive layer, between the metal layer and the semiconductor layer. Broadly speaking, these layers are deposited by vacuum evaporation or sputtering, and provide an improvement of 1 $mA/cm^2$ or more in terms of the short-circuit current density Jsc.

As examples of these configurations, the reflectivity of the reflection layer consisting of silver atoms and the textured structure are investigated in the Extended Abstract of the 51st Autumn Meeting of the Japan Society of Applied Physics (1990), 29p-MF-2, p747 "Optical confinement effect in a-SiGe solar cells on stainless steel substrates" and Sannomiya et al., Technical Digest of the International PVSEC-5, Kyoto, Japan, p381, 1990 "P-IA-15a-SiC/a-Si/a-SiGe multi-bandgap stacked solar cells with bandgap profiling". In these examples, effective irregularities are formed by depositing silver with change in substrate temperature to obtain two reflection layers, and an increase in the short-circuit current is achieved by the optical confinement effect and the combination with a zinc oxide layer.

Conventionally, a zinc oxide layer is formed by sputtering, ion plating or CVD. The zinc oxide layer adapted for use in the photovoltaic element can be formed by sputtering, and desirable results can be easily obtained particularly by magnetron sputtering.

A zinc oxide layer consisting of hexagonal polycrystals can be formed on a substrate opposed to a target, by employing sintered zinc oxide as the target, generating a surface magnetic flux density of 50 to 800 Gauss on the surface of the target and applying a voltage. A sputtering gas can be composed of argon eventually added with oxygen, and the sputtering pressure is 1 Torr or less.

However, the zinc oxide film prepared in this method shows an insufficient light confinement effect in the wavelength range of 600 nm to 1000 nm, and there are drawbacks of a high preparation cost of the target material and a high depreciation cost of the vacuum apparatus.

As alternative methods, there are also known wet methods such as the spray pyrolysis method or sol-gel method, but the necessity of heating the substrate to about 300° C. to 800° C. limits the substrates to be used, thereby significantly increasing the cost of manufacturing the photovoltaic element by these methods, thus posing a major barrier for industrial application of the solar cells.

As a countermeasure for the above problems, there has been reported electrochemical deposition of a thin transparent zinc oxide film by supplying a current from a counter electrode immersed in an aqueous solution of zinc nitrate, as disclosed in the specification of the Japanese Patent Application No. 7-23775, which corresponds to Japanese Patent Application Laid-Open No. 8-217443, and Masanobu Izaki and Takahasi Omi, "Electrolyte optimization for cathodic growth of zinc oxide films", Journal of Electrochemical Soc., Vol. 143, No. 3. These methods dispensing with an expensive vacuum apparatus or an expensive target can drastically reduce the manufacturing cost of the zinc oxide film. Also these methods are effective for the photovoltaic element with a large area such as solar cells, because the deposition can be also conducted on a large-area base member.

SUMMARY OF THE INVENTION

An object of the present invention is to provide an apparatus for forming a thin zinc oxide film, capable of forming a thin zinc oxide film of satisfactory film quality on a conductive base member with a high production yield for a long time, thereby enabling inexpensive and stable supply of the zinc oxide film.

The present invention provides an apparatus for forming a thin zinc oxide film on a conductive base member by immersing the conductive base member and a counter electrode in an aqueous solution and supplying a current between the conductive base member and the counter electrode, wherein a distance between the counter electrode and the base member is 50 mm or more at the end portion of the counter electrode and is 5 mm to 40 mm at the central portion of the counter electrode.

The present invention also provides an apparatus for forming a thin zinc oxide film on a conductive base member by immersing the conductive base member and a counter electrode in an aqueous solution and supplying a current between the conductive base member and the counter electrode, wherein the end portion of the counter electrode is folded by an angle of −1° to −90° with respect to the conductive base member.

Further, the present invention provides a method of forming a thin zinc oxide film on a conductive base member by immersing the conductive base member and a counter electrode in an aqueous solution and supplying a current between the conductive base member and the counter electrode, which comprises maintaining a distance between the counter electrode and the base member at 50 mm or more on the end portion of the counter electrode and at 3 mm to 40 mm on the central portion of the counter electrode.

Additionally, the present invention provides a method of forming a thin zinc oxide film on a conductive base member by immersing the conductive base member and a counter electrode in an aqueous solution and supplying a current between the conductive base member and the counter electrode, wherein the end portion of the counter electrode is folded by an angle of −1° to −90° with respect to the conductive base member.

In the present invention, the end portion of the counter electrode is preferably opposed to a region of the conductive base member in the vicinity of the surface of the aqueous solution, and the conductive base member is preferably an elongated base member supported between a base member feeding roller and a base member wind-up roller and supplied in the aqueous solution. Also in the present invention, a substance containing zinc as a main component is preferably immersed in the aqueous solution, and the container for the aqueous solution is preferably equipped with a device for maintaining the solution at a constant temperature, a device for agitating or circulating the solution and a device for maintaining the solution at a constant concentration. It is furthermore preferable that the aqueous solution contains at least zinc ions, nitrate ions and hydrocarbon, and that pH of the aqueous solution is controlled within a range from 3 to 7.

DESCRIPTION OF THE PREFERRED EMBODIMENTS

Figure 1:
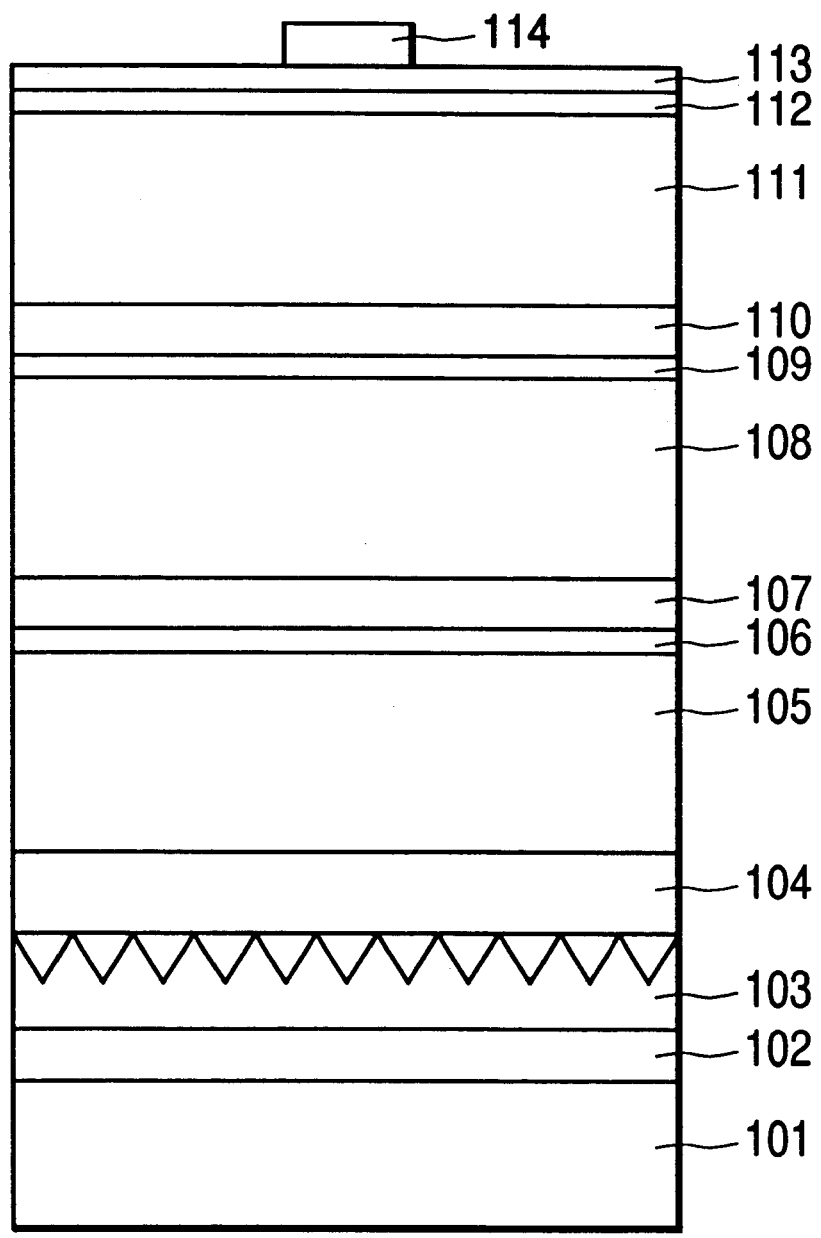
FIG. 1 is a schematic sectional view showing the structure of a photovoltaic element.

As described in the foregoing, the present invention relates to a novel apparatus for forming a thin zinc oxide film, and the configuration and functions of the present invention will be explained in the following.

(1) The distance between the counter electrode and the conductive base member is set to 50 mm or more when the base member is positioned close to the surface of the electrodepositing solution, thereby suppressing the abnormal growth and white turbidity of the film which are encountered at least in the vicinity of the solution surface, and therefore significantly improving the film quality and the production yield.

(2) The end portion of the counter electrode is folded within a range of −1° to −90°, particularly −30° to −60°, with respect to the conductive base member, thereby providing evident improvement in the film quality and the production yield.

(3) The conductive base member is an elongated base member supported between the base member feeding roller and the base member wind-up roller and supplied continuously into the aqueous solution, thereby enabling mass production of a transparent conductive layer consisting of zinc oxide, and achieving cost reduction of the photovoltaic elements.

(4) A substance mainly composed of zinc as a zinc ion supply source is immersed in the aqueous solution to cause generation of zinc ions from such substance and therefore maintain zinc ions at an amount equal to or larger than the amount required for the zinc oxide film formation. As a result, it enables film formation for a long time without zinc ion replenishment from the outside. Also the cost of zinc can be reduced since zinc ion supply is not dependent on the shape of the substance mainly composed of zinc.

(5) The container for housing the aqueous solution, equipped with the device for maintaining the solution at a constant temperature, the device for agitating or circulating the solution and the device for maintaining the solution at a constant concentration allows formation of a zinc oxide film with predetermined crystal grain size and orientation, thereby allowing to obtain a thin zinc oxide film of uniform crystal grain size and uniform orientation even in film formation for a long time.

(6) The aqueous solution containing at least zinc ions, nitrate ions and hydrocarbon and controlled within a pH range of 3 to 7 allows deposition of a thin zinc oxide film of excellent uniformity with little abnormal growth, for a long time.

The transparent conductive layer of zinc oxide formed by the apparatus of the present invention is formed by an electrochemical method and therefore can reduce the production cost to about 1/100 in comparison with that in the conventional sputtering method. Also the photovoltaic element utilizing the transparent conductive layer, formed by the thin zinc oxide film forming apparatus of the present invention, shows an excellent reflectance to the light of the wavelength region of 600 nm to 1000 nm, by employing a metal element of a high reflectance in the back surface reflection layer. Consequently the photovoltaic element utilizing the transparent conductive layer, formed by the thin zinc oxide film forming apparatus of the present invention, has a high quality and a low electric power cost.

Now the present invention will be described in detail with preferred embodiments thereof, but it is not limited to them as long as the scope of the present invention can be attained.

Figure 2:
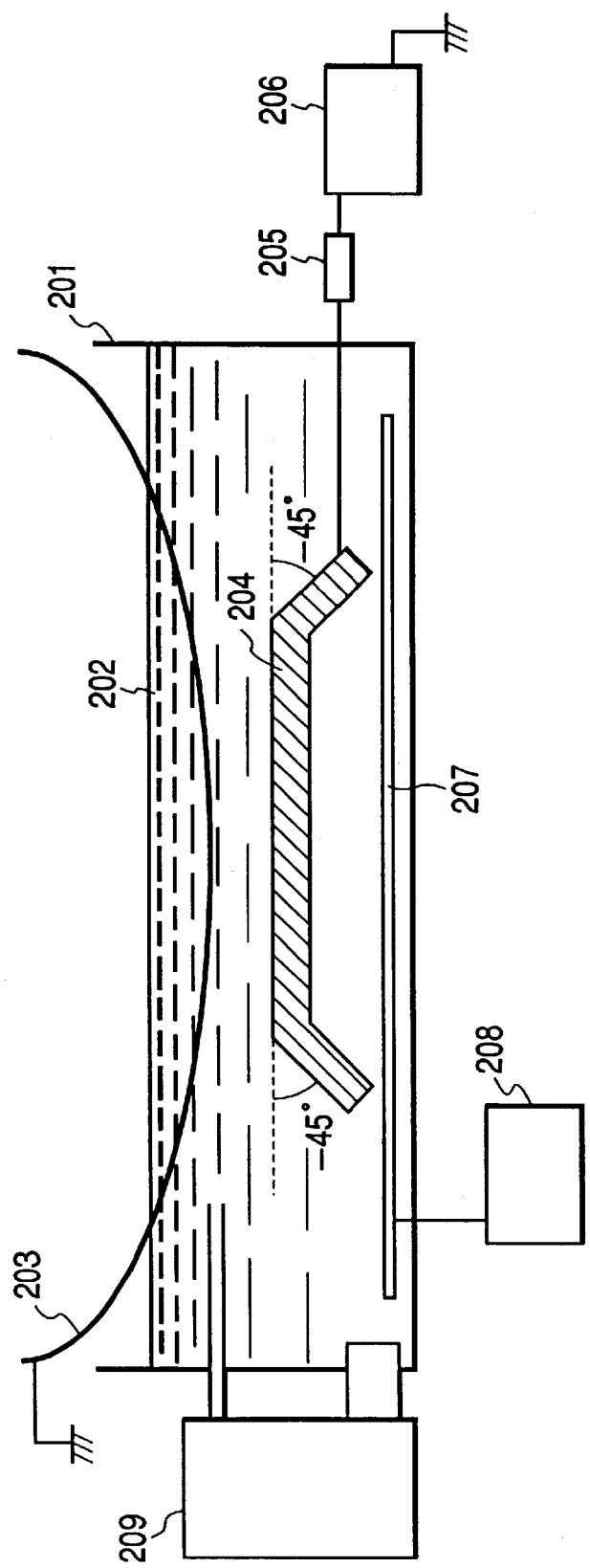
FIGS. 2 and 3 are schematic sectional views showing a thin zinc oxide film forming apparatus of the present invention.

FIG. 2 shows an example of the thin zinc oxide film forming apparatus of the present invention. Reference numeral 201 indicates an anticorrosive container having an electrodepositing solution 202 consisting of an aqueous solution containing nitrate ions and zinc ions. A hydrocarbon is added as an additive to the electrodepositing solution 202.

Each concentration of the nitrate ions and zinc ions is within a range from 0.002 to 2.0 mol/liter, preferably 0.005 to 1.0 mol/liter, and most preferably 0.025 to 0.3 mol/liter.

The source of supply of nitrate ions and zinc ions can be zinc nitrate which can supply both ions, or a mixture of a water-soluble nitrate salt such as ammonium nitrate which can supply nitrate ions, and a zinc salt such as zinc sulfate which can supply zinc ions. In particular, the zinc ions can be replenished at an amount equal to or larger than an amount required for the thin zinc oxide film formation by immersing a substance mainly composed of zinc in the electrodepositing solution.

The additive can be any hydrocarbon, for example monosaccharide such as glucose or fructose, disaccharide such as maltose or saccharose, polysaccharide such as dextrin, cellulose or starch, or a mixture thereof.

For obtaining the thin zinc oxide film with excellent uniformity and adhesion and without abnormal growth, the amount of hydrocarbon is preferably within a range of 0.001 to 300 g/liter, more preferably 0.01 to 200 g/liter.

A conductive base member 203 is used as a cathode. A counter electrode 204 of folded shape can be composed not only of zinc but also of platinum or carbon, but is preferably composed of zinc in particular. The counter electrode 204 is used as an anode. In this case, a distance between the counter electrode and the base member is preferably 3 mm to 40 mm at the central portion of the counter electrode, and preferably 50 mm or more at the end portion of the counter electrode. The end portion of the counter electrode is preferably folded by an angle within a range of −1° to −90°, more preferably −30° to −60°, with respect to the central portion of the counter electrode.

The conductive base member 203 constituting the cathode and the counter electrode 204 constituting the anode are connected to a power source 206 through a load resistor 205, so as to pass a substantially constant current. The current applied is preferably within a range of 0.1 to 100 mA/cm$^2$, more preferably 1 to 30 mA/cm$^2$, and most preferably 2 to 15 mA/cm$^2$.

The temperature of the solution is preferably within a range of 50° C. to 90° C. For agitating the entire solution, there is employed a solution circulating device 209 such as a circulating pump. In a smaller apparatus there can also be employed a magnetic stirrer.

These film forming conditions cannot be uniformly determined as they are variable depending on the kind, sectional shape and crystalline state of the metal layer in the photovoltaic element as will be explained later, but in general a higher concentration of zinc nitrate generates larger crystal grains of zinc oxide and facilitates formation of the surface irregularities. Also a lower film forming temperature tends to generate larger crystal grains of zinc oxide, and a higher current density tends to decrease the surface irregularities.

However, since a current density is almost in proportional to a film formation speed, it is preferable that surface irregularity is formed in a state of an increased current density in order to reduce a cost for forming a thin zinc oxide film.

Figure 4:
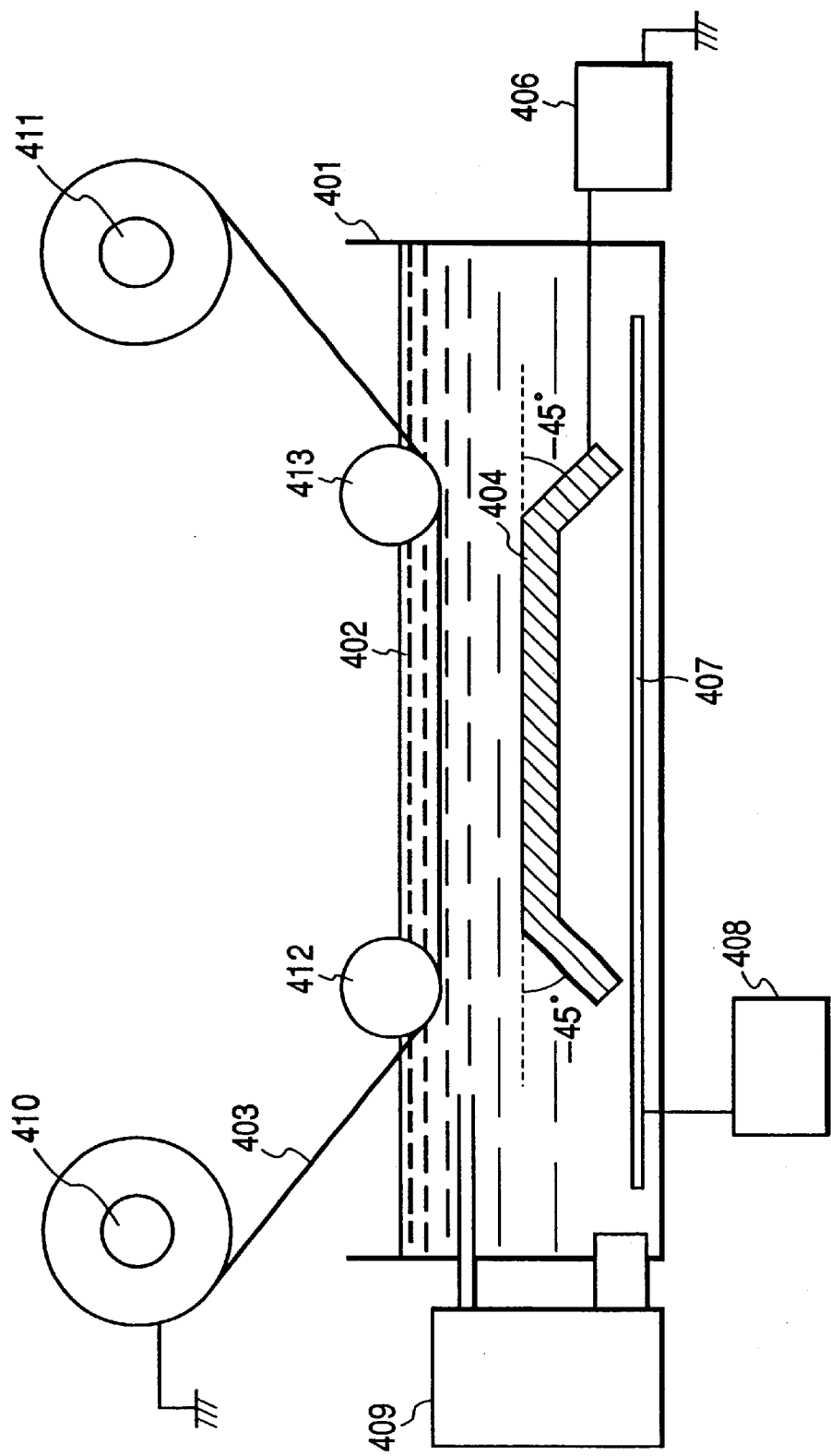
FIGS. 4 and 5 are schematic sectional views showing a thin zinc oxide film forming apparatus of the present invention utilizing an elongated conductive base member.

In the following, there will be given a detailed explanation on another example of the thin zinc oxide film-forming apparatus of the present invention, employing an elongated conductive base member and a zinc counter electrode with folded end portions. FIG. 4 is a schematic view showing an apparatus for forming a thin zinc oxide film on an elongated conductive base member.

At first an anticorrosive container 401 is filled with an aqueous solution (electrodepositing solution) 402 of zinc nitrate having a predetermined concentration, and the electrodepositing solution is sufficiently circulated with a circulating device 409 and is maintained at a predetermined temperature with a heater 407. Numeral 408 indicates a power source for the heater 407. Then the elongated conductive base member 403 is set between a base member feeding roller 410 and a base member wind-up roller 411 and immersed in the electrodepositing solution 402 through transport rollers 412, 413, and a zinc counter electrode 404 of folded shape is provided in an opposed relationship. In this case, a distance between the counter electrode and the base member is preferably 3 mm to 40 mm at the central portion of the counter electrode, and preferably 50 mm or more at the end portion of the counter electrode the end portions of the counter electrode are preferably folded by an angle within a range of −1° to −90°, more preferably −30° to −60° with respect to the central portion of the counter electrode.

A transparent thin film of zinc oxide is deposited on the surface of the elongated conductive base member by applying, between the elongated conductive base member and the zinc counter electrode of the folded shape, a voltage from the power source 406 in a constant current mode. The elongated conductive base member supplied from the feeding roller 410 is subjected in succession to the formation of the transparent conductive layer, and is then wound by the wind-up roller 411.

In the following there will be given an explanation on a photovoltaic element provided with the thin zinc oxide film formed by the thin zinc oxide film-forming apparatus of the present invention.

FIG. 1 is a schematic sectional view showing the cross-sectional structure of the photovoltaic element. Referring to FIG. 1, on the conductive base member 101, there are stacked in succession a metal layer 102, a transparent conductive layer 103 consisting of the thin zinc oxide film formed by the thin zinc oxide film-forming apparatus of the present invention, semiconductor layers 104 to 112, a transparent electrode layer 113, a current collecting electrode 114, and these components will be explained in the following.

[Base Member]

The base member 101 can be composed of a metal plate such as stainless steel plate, steel plate, brass plate or aluminum plate, or resin, glass or ceramics coated with a conductive material. The surface of the base member may be provided with fine irregularities. Also a transparent base member may be employed to realize a configuration receiving the light from the base member side. An elongated sheet-shaped base member can be used as the base member and wound in a coil, thereby enabling continuous film formation and facilitating storage and transportation. In particular, stainless steel and polyimide resin are preferred examples of the material constituting the base member since they are flexible.

[Metal Layer]

The metal layer 102 serves as an electrode and also as a reflection layer for reflecting the light reaching the base member, thereby causing re-utilization of the light in the semiconductor layers. The metal layer is formed for example with Al, Cu, Ag or Au by evaporation, sputtering, electrolytic deposition, printing, etc. The metal layer may be provided with surface irregularities to extend the optical path length of the reflected light in the semiconductor layers, thereby increasing the short circuit current. The metal layer may not be formed in case the base member itself is conductive.

[Transparent Conductive Layer]

The transparent conductive layer 103 increases the random reflection of the incident light and the reflected light, thereby extending the optical path length in the semiconductor layers. It also prevents shunting of the photovoltaic element, resulting from diffusion or migration of the element constituting of the metal layer into the semiconductor layers. Furthermore, it is provided with an appropriate electrical resistance to prevent short circuit generated from defects in the semiconductor layers such as pinholes.

As in case of the metal layer, the transparent conductive layer is preferably provided with surface irregularities. The transparent conductive layer 103 is formed with a conductive oxide such as ZnO or ITO, by evaporation, sputtering, CVD or electrolytic deposition. The present embodiment employs electrolytic deposition which is less in the cost of the apparatus and of the material.

[Semiconductor Layers]

The semiconductor layers are composed of semiconductor materials constituting for example a pn junction, a pin junction, a Schottky junction or a hetero junction, and the examples of such semiconductor materials include hydrogenated amorphous silicon, hydrogenated amorphous silicon germanium, hydrogenated amorphous silicon carbide, microcrystalline silicon and polycrystalline silicon.

For continuous formation on the elongated base member, particularly suited are Si, C, Ge and alloys thereof in amorphous or microcrystalline state. At the same time, hydrogen and/or halogen atoms are contained with a preferred content within a range of 0.1 to 40 atomic %. There may be further contained oxygen, nitrogen, etc. The concentration of such impurities preferably does not exceed $5 \times 10^{19}$ cm$^{-3}$. Also an element of the group III of the periodic table is contained in order to obtain a p-type semiconductor. An element of the group V is contained to obtain an n-type semiconductor.

In case of a stacked cell, the band gap of the i-type semiconductor layer of the pin junction close to the light incident side is preferably wider, and as the i-type semiconductor layer farther from the light incident side, the band gap becomes narrower.

The doped layer at the light incident side is preferably composed of a crystalline semiconductor with low light absorption or a semiconductor with a wide band gap.

The semiconductor layers can be advantageously formed by microwave CVD, plasma CVD or high-frequency (RF) CVD.

[Transparent Electrode]

The transparent electrode 113 can also function as an antireflection layer by suitably setting the thickness. The transparent electrode 113 can be formed with ITO, ZnO or In$_2$O$_3$ for example by evaporation, CVD, spray coating, spin coating or immersion coating. Such material may further contain a substance for varying the electroconductivity.

[Current Collecting Electrode]

The current collecting electrode is provided for improving the current collecting efficiency, and can be formed for example by sputtering with a mask to obtain a metal of the electrode pattern, by printing a conductive paste or solder paste, or by fixing a metal wire with a conductive paste.

Further, protective layers may be formed if necessary on both sides of the photovoltaic element. Also there may be used a reinforcing material such as a steel plate.

In the following the present invention will be further described referring to by a solar cell as an example of the photovoltaic element, but the present invention is not limited to such example.

EXAMPLE 1

A forming apparatus shown in FIG. 2 is capable of continuously forming, in aqueous solution, a transparent conductive layer consisting of zinc oxide on the surface of the conductive base member 203. The conductive base member 203 constituting a negative side cathode was composed of stainless steel (SUS430BA) of a thickness of 0.12 mm, sputtered thereon with aluminum in a thickness of 100 nm and then with ZnO with a thickness of 100 nm and covered on the back surface with a tape.

The counter electrode was composed of a 4-N zinc plate of which end portions were folded by an angle of –45° in such a manner that the distance from the conductive base member to the counter electrode increased as the conductive base member approached the solution surface. The distance between the conductive base member and the counter electrode was set to 10 mm at the central portion of the counter electrode and 80 mm at the end portions.

An anticorrosive container 201 was filled with the aqueous solution of zinc nitrate having a concentration of 0.05 mol/liter, added with saccharose of 20 g/liter. The electrodepositing solution 202 was agitated and circulated by a circulating device 209, incorporating a dust removing filter, and maintained at a constant temperature of 85° C. by an internal heater 207 incorporated into the container. The film formation was conducted for 30 minutes, with an applied current of 1.0 mA/cm$^2$ (0.1 A/dm$^2$). This film formation was conducted twice.

Comparative Example 1

A zinc oxide thin film was formed in the same manner as in Example 1, except that a flat plate-shaped Zn electrode was used as the counter electrode.

The deposition rate measured from the optical characteristics of the obtained electrodeposited films revealed that the thicknesses of two thin zinc oxide films formed by using the counter electrode with the end portions folded with an angle of –45° were almost equal to, specifically 0.98 and 0.99 times respectively, that in Comparative Example 1.

Also the number of abnormal growths of two films in Example 1 was significantly improved, that is, 0.60 and 0.58 times respectively of that of Comparative Example 1. Particularly in the vicinity of the solution surface, Comparative Example 1 showed white turbidity in the film, presumably by the influence of the abnormal growth, but Example 1 did not show such white turbidity in the film. Furthermore, the direct reflectivity and the random reflectivity in the case of Example 1 were improved respectively as 1.10 and 1.08 times of those in Comparative Example 1.

EXAMPLE 2

Figure 3:
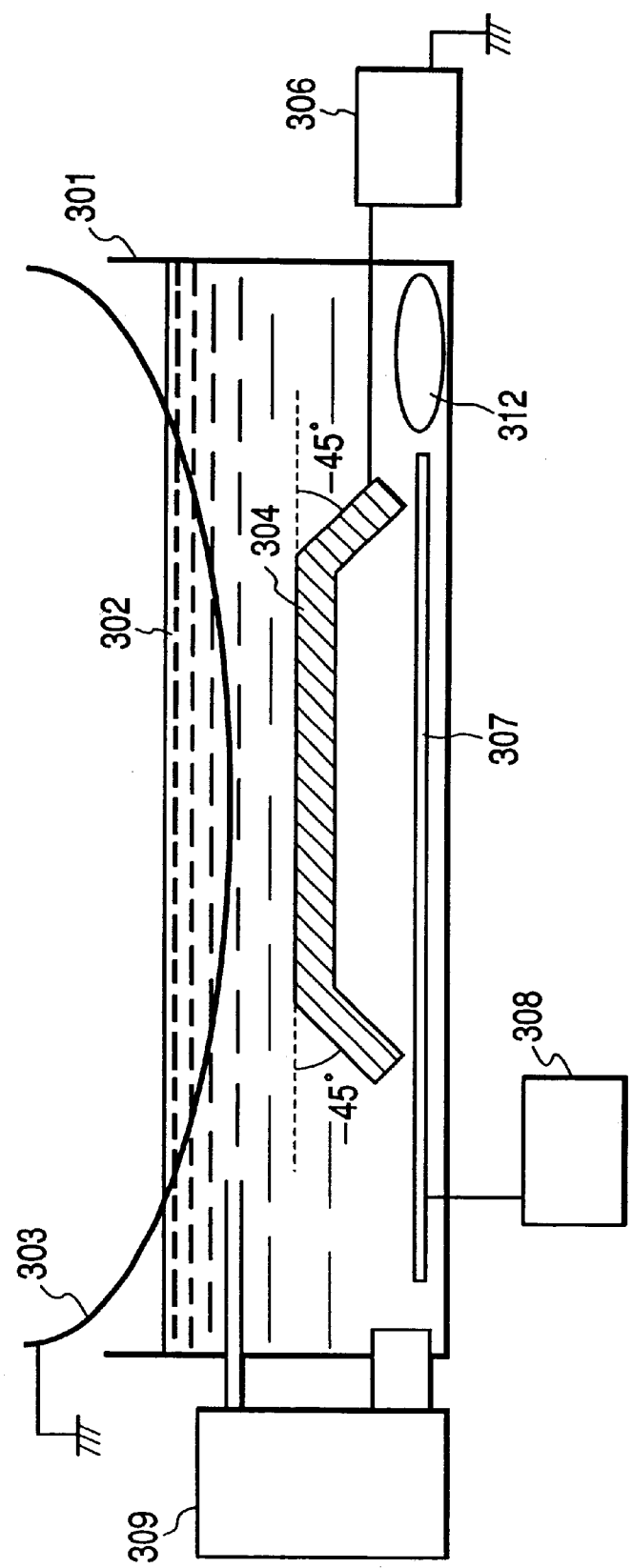

A forming apparatus shown in FIG. 3 is capable of continuously forming, in an aqueous solution, a transparent conductive layer consisting of zinc oxide on the surface of the conductive base member 303. The conductive base member 303 constituting a negative side cathode was composed of stainless steel (SUS430BA) of a thickness of 0.12 mm, sputtered thereon with silver in a thickness of 200 nm and covered on the back surface with a tape.

The counter electrode was composed of stainless steel (SUS430) of which end portions were folded by an angle of –45° with respect to the central portion of the electrode in such a manner that the distance from the conductive base member to the counter electrode increased as the conductive base member approached the solution surface. The distance between the conductive base member and the counter electrode was set to 20 mm at the central portion of the counter electrode and 70 mm at the end portions of the counter electrode.

An anticorrosive container 301 was filled with the aqueous solution of zinc nitrate having a concentration of 0.05 mol/liter, added with saccharose of 20 g/liter, in which a zinc block was immersed. The electrodepositing solution 302 was agitated and circulated by a circulating device 309, incorporating a dust removing filter, and maintained at a constant temperature of 85° C. by an internal heater 307 incorporated into the container. The film formation was conducted for 10 minutes, with an applied current of 1.0 mA/cm$^2$ (0.1 A/dm$^2$).

The deposition rate measured from the optical characteristics of the obtained electrodeposited films revealed that the thicknesses of the zinc oxide films formed by using the counter electrode with the end portions folded with an angle of −45° were almost equal to, specifically 0.99 and 1.00 times respectively, that in Comparative Example 1.

Also the number of abnormal growths in Example 2 was significantly improved and 0.65 and 0.62 times of that of Comparative Example 1. Particularly in the vicinity of the solution surface, Comparative Example 1 showed white turbidity in the film, presumably by the influence of the abnormal growth, but Example 2 did not show such white turbidity in the film. Furthermore, the direct reflectivity and the random reflectivity were improved respectively as 1.08 and 1.07 times of those in Comparative Example 1.

EXAMPLE 3

A forming apparatus shown in FIG. 4 is provided with a roll-to-roll transporting system and a folded counter electrode, and is capable of continuously forming, in an aqueous solution, a transparent conductive layer consisting of zinc oxide on the surface of the conductive base member 403. The conductive base member 403 constituting a negative side electrode was composed of stainless steel (SUS430BA) having a thickness of 0.15 mm and a length of 300 m, sputtered thereon with silver in a thickness of 100 nm. The distance between the conductive base member and the counter electrode was set to 8 mm at the central portion of the counter electrode and 100 mm at the end portions of the counter electrode.

The counter electrode was composed of a 4-N zinc plate having had end portions folded by an angle of −45° with respect to the central portion of the electrode in such a manner that the distance from the conductive base member to the counter electrode increased as the elongated conductive base member approached the solution surface.

An anticorrosive container 401 was filled with the aqueous solution of zinc nitrate having a concentration of 0.08 mol/liter. The electrodepositing solution 402 was agitated and circulated by a circulating device 409 incorporating a dust removing filter, and maintained at a constant temperature of 65° C. by an internal heater 407 incorporated into the container. The applied current was 1.5 mA/cm$^2$ (0.15 A/dm$^2$), and nitric acid was periodically added to maintain the aqueous solution at a pH value 5.5.

Comparative Example 2

A thin film of zinc oxide was formed in the same manner as in Example 3, except that a 5-N zinc plate was used as the counter electrode. The distance between the conductive base member and the counter electrode was set to 35 mm.

The electrodeposited films thus obtained were subjected to the measurements of the reflectivity, the random reflectivity and the number of abnormal growths in the transversal and longitudinal directions. The results were evaluated up to a length of 100 m from the start of film formation, provided that the result at a length of 5 m from the start of film formation in Example 3 was regarded as unity.

In the following there are shown results obtained in Example 3 and Comparative Example 2.

TABLE 1

|  | Example 3 | | | Comparative Example 2 | | |
| --- | --- | --- | --- | --- | --- | --- |
|  | Reflectivity | Abnorm. growth number | Film thickness | Reflectivity | Abnorm. growth number | Film thickness |
| 5 m | 1.0 times | 1.0 times | 1.0 times | 1.0 times | 1.0 times | 1.0 times |
| 20 m | 1.0 times | 1.0 times | 0.9 times | 0.9 times | 1.2 times | 0.9 times |
| 50 m | 0.9 times | 1.1 times | 0.9 times | 0.8 times | 1.3 times | 0.7 times |
| 100 m | 1.0 times | 1.1 times | 1.0 times | 0.6 times | 1.5 times | 0.7 times |

The reflectivity and the number of abnormal growths both showed remarkable difference with the increase of the formed film length, and Example 3 showed superior results in both properties to Comparative Example 2, while indicating a uniform film thickness distribution.

EXAMPLE 4

Figure 5:
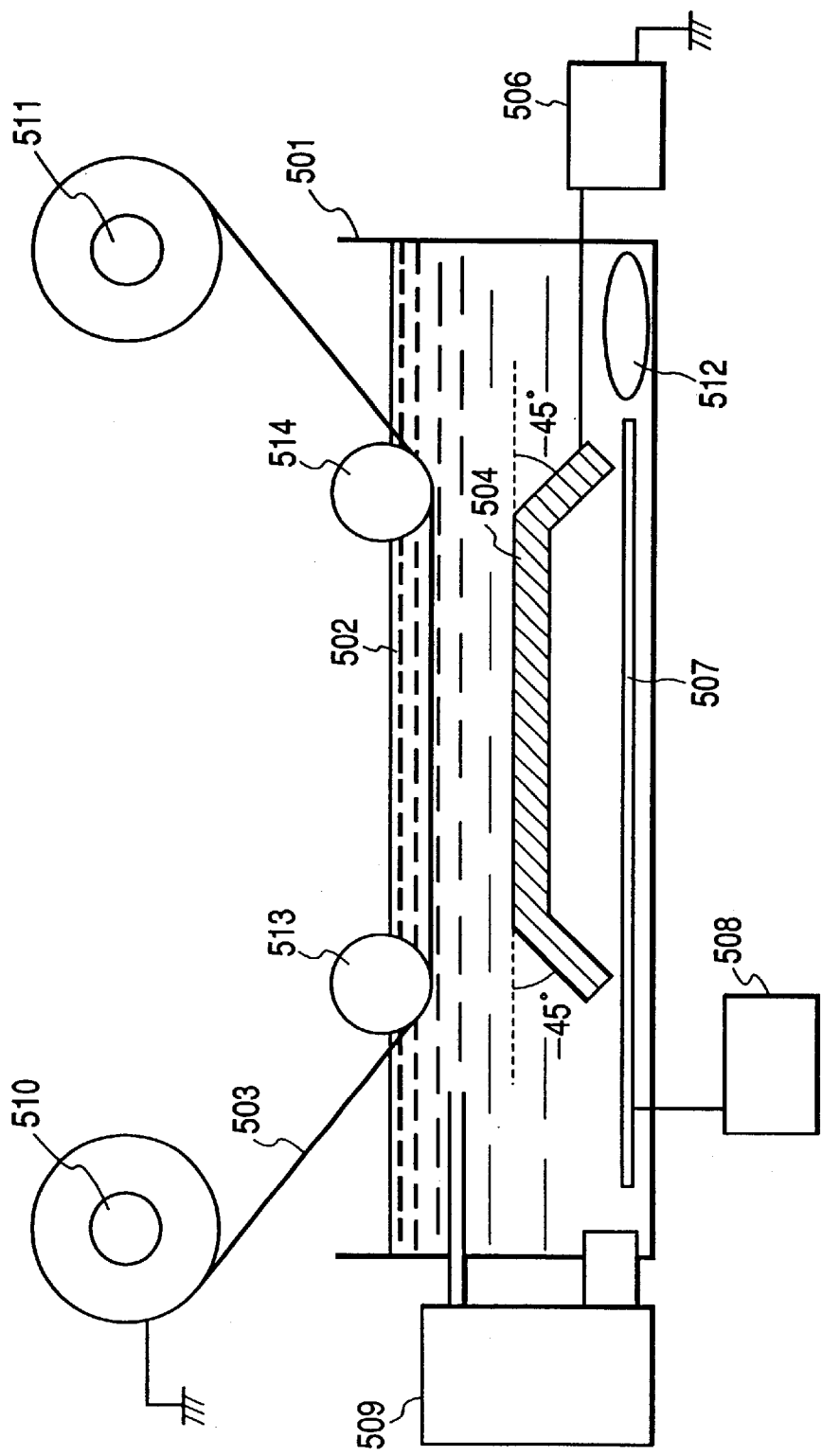

A forming apparatus shown in FIG. 5 is provided with a roll-to-roll transporting system and a folded counter electrode 504, and is capable of continuously forming, in an aqueous solution 502, a transparent conductive layer consisting of zinc oxide on the surface of the conductive base member 503. The conductive base member 503 constituting a negative side electrode was an elongated base member composed of a stainless steel (SUS430BA) having a thickness of 0.18 mm and a length of 300 m, sputtered thereon with silver in a thickness of 100 nm.

The counter electrode 504 was composed of a stainless steel plate (SUS304) having end portions folded by an angle of −45° with respect to the central portion of the electrode in such a manner that the distance from the conductive base member to the counter electrode increased as the elongated conductive base member approached the solution surface. The distance between the conductive base member and the counter electrode was set to 10 mm at the control portion of the counter electrode and 110 mm at the end portions of the counter electrode.

An anticorrosive container 501 was filled with the aqueous solution 502 of zinc nitrate having a concentration of 0.08 mol/liter, in which a 5-N zinc block 512 was immersed. The electrodepositing solution 502 was agitated and circulated by a circulating device 509 incorporating a dust removing filter, and maintained at a constant temperature of 65° C. by an internal heater 507 incorporated into the container. The applied current was 2.0 mA/cm$^2$ (0.2 A/dm$^2$), and nitric acid was periodically added to maintain the aqueous solution at a pH value 5.5. Numeral 506 indicates a power source, 508 a power source for the heater 507, 510 a feeding roller, 511 a wind-up roller, and 513 and 514 transport rollers.

Comparative Example 3

A thin film of zinc oxide was formed in the same manner as in Example 3, except that the counter electrode was composed of a 5-N zinc plate similar to Comparative Example 2.

The electrodeposited films thus obtained were subjected to the measurements of the reflectivity, the random reflectivity and the number of abnormal growths in the transversal and longitudinal directions. The results were evaluated up to a length of 100 m from the start of film formation, provided that the result at a length of 5 m from the start of film formation in Example 4 was regarded as unity.

As a result, Example 4 showed superior results both in the reflectivity and the number of abnormal growths, similarly to Example 3, in comparison with Comparative Example 3.

EXAMPLE 5-1

In Example 5-1, a thin film of zinc oxide was formed with the forming apparatus shown in FIG. 2.

The conductive base member 203 constituting a negative side electrode was composed of a stainless steel (SUS430BA) having a thickness of 0.12 mm, sputtered thereon with silver in a thickness of 200 nm and covered on the back surface with a tape.

The counter electrode 204 was composed of a 5-N zinc electrode having end portions folded by an angle of −45° with respect to the central portion of the electrode in such a manner that the distance from the conductive base member to the counter electrode increased as the elongated conductive base member approached the solution surface.

The anticorrosive container 201 was filled with the aqueous solution of zinc nitrate of a concentration of 0.05 mol/liter added with saccharose of 20 g/liter. The electrodepositing solution 202 was agitated and circulated by a circulating device 209 incorporating a dust removing filter, and maintained at a constant temperature of 65° C. by an internal heater 207 incorporated into the container. The applied current was 2.0 mA/cm$^2$ (0.2 A/dm$^2$), and nitric acid was periodically added to maintain the aqueous solution at a pH value 5.5. The electrolytic deposition was conducted for 1 hour in total, while samples were prepared at an interval of 15 minutes.

EXAMPLE 5-2

The electrolytic deposition was executed in the same manner as in Example 5-1, except that the pH value of the aqueous solution was not controlled. The electrolytic deposition was conducted for 1 hour in total, while samples were prepared at an interval of 15 minutes.

There were measured the film thickness and the level of the abnormal growth evaluated with a scanning electron microscope (SEM).

The results obtained in Examples 5-1 and 5-2 are shown in the following.

TABLE 2

| | Example 5-1 | | Example 5-2 | |
|---|---|---|---|---|
| Time (min.) | Film thickness | Abnorm. growth number | Film thickness | Abnorm. growth number |
| 0–15 | 1.0 times | 1.0 times | 1.0 times | 1.0 times |
| 15–30 | 1.1 times | 1.1 times | 0.9 times | 1.2 times |
| 30–45 | 0.9 times | 1.1 times | 0.8 times | 1.3 times |
| 45–60 | 1.0 times | 1.0 times | 0.6 times | 1.3 times |

Example 5-1 with pH control did not show changes in the film thickness and in the number of abnormal growths with the lapse of time, but, in Example 5-2 without pH control, the film thickness gradually decreased and the number of abnormal growths increased with the lapse of time.

EXAMPLE 6

The forming apparatus shown in FIG. 4 was used to produce a solar cell as shown in FIG. 1 with three pin junctions on a thin zinc oxide film formed under the same conditions as in Example 3. More specifically, the solar cell had a configuration of: conductive base member 101/back surface reflection layer 102 (Ag)/transparent conductive layer 103 (ZnO)/first n-type layer 104 (a-Si:H:B)/first i-type layer 105 (a-SiGe:H)/first p-type layer 106 (μc-Si:H:B)/second n-type layer 107 (a-Si:H:P)/second i-type layer 108 (a-SiGe:H)/second p-type layer 109 (μc-Si:H:B)/third n-type layer 110 (a-Si:H:P)/third i-type layer 111 (a-Si:H)/third p-type layer 112 (μc-Si:H:B)/transparent electrode layer 113 (ITO)/current collecting electrode 114 (Cu wire/Ag/C). The back surface reflection layer was prepared by a conventional vacuum evaporation.

Comparative Example 4

A single transparent electrode layer consisting of zinc oxide was formed by conventional sputtering, and a solar cell of the cross-sectional configuration shown in FIG. 1 was produced. The production of the solar cell was executed in the same manner as in Example 6, except for differences in the forming method of the transparent electrode layer and in the cross-sectional shape thereof.

At first, initial characteristics (photoconductive characteristics and short circuit current) were measured on the solar cells of Example 6 and Comparative Example 4. The photoelectric converting efficiency and the short circuit current were measured with a solar simulator (AM 1.5, 100 mW/cm$^2$, surface temperature 25° C.). These characteristics of the photovoltaic element of Example 6 was superior by 1.13 times and 1.15 times respectively, in comparison with those of the photovoltaic element of Comparative Example 4.

Then a high-temperature high-humidity test was executed as an acceleration test. Two solar cells were placed in an environmental test box, left under a condition of a temperature of 90° C. and a relative humidity of 80% for 200 hours, then left under a condition of a temperature of 25° C. and a relative humidity of 50% for 1 hour, thereafter the solar cells were taken out. Measurement of the photoelectric converting efficiency and the short circuit current of the photovoltaic elements in the same manner as in the above revealed that the photovoltaic element provided on the thin zinc oxide film of Example 6 was superior in these properties by 1.04 times and 1.05 times respectively in comparison with those of the photovoltaic element of Comparative Example 4.

Then a light irradiation test was conducted by exposing the photovoltaic elements to the above-mentioned solar simulator (AM 1.5, 100 mW/cm$^2$, surface temperature 50° C.) for 1000 hours. Both photovoltaic elements did not show defects in the appearance after the test. Measurement of the photoelectric converting efficiency and the short circuit current did not show difference in the loss of the photoelectric converting efficiency after the test.

The ratio of the photoelectric converting efficiency before and after the test (efficiency after test/efficiency before test) was 0.92 in the example 6 and 0.83 in average in the comparative example 4.

As explained in the foregoing, there was confirmed the superiority of the photovoltaic element provided on the thin zinc oxide film formed by the zinc oxide thin film forming apparatus of the present invention.

According to the present invention, as explained in the foregoing, the distance between the counter electrode and the conductive base member increases as the base member approaches the solution surface, so that it is rendered possible to suppress the abnormal growth of the film and the turbidity therein, which are encountered at least in the vicinity of the solution surface, and to form the thin zinc oxide film of satisfactory quality on the conductive base member for a long time with a satisfactory production yield, thereby enabling inexpensive and stable production of the thin zinc oxide film.

Also the zinc oxide film formed by the electrolytic deposition of the present invention can be significantly improved in the transmissivity and in the durability, in comparison with the zinc oxide film formed by the sputtering method.

Furthermore, in comparison with the conventional electrodeposited film formation with the flat plate-shaped counter electrode, the present invention can suppress turbidity formation and abnormal growth in the film and is excellent in cost reduction of the material, etc., thereby enabling significant reduction of the production cost of the solar cell.

What is claimed is:

1. An apparatus for forming a thin zinc oxide film on a conductive base member by immersing said conductive base member and a single counter electrode in an aqueous solution having a surface and supplying a current between said conductive base member and said counter electrode, wherein a distance between said counter electrode and said base member is 50 mm or more at each end portion of said counter electrode opposed to regions of said conductive base member when the base member is positioned close to the surface of said solution, and is 3 mm to 40 mm at a central portion of said counter electrode.

2. An apparatus for forming a thin zinc oxide film according to claim 1, wherein said end portions of said counter electrode are folded by an angle of −1° to −90° with respect to said conductive base member.

3. An apparatus for forming a thin zinc oxide film according to claim 1, wherein said conductive base member is an elongated base member supported between a base member feeding roller and a base member wind-up roller and supplied into said aqueous solution.

4. An apparatus for forming a thin zinc oxide film according to claim 1, wherein a substance containing zinc as a main component is immersed in said aqueous solution.

5. An apparatus for forming a thin zinc oxide film according to claim 1, wherein a container housing said aqueous solution is provided with a device for maintaining a temperature of the solution at a constant value, a device for agitating or circulating the solution, and a device for maintaining a concentration of the solution at a constant value.

6. An apparatus for forming a thin zinc oxide film according to claim 1, wherein said aqueous solution contains at least zinc ions, nitrate ions and hydrocarbon.

7. An apparatus for forming a thin zinc oxide film according to claim 1, wherein a pH value of said aqueous solution is controlled within a range of 3 to 7.

8. An apparatus for forming a thin zinc oxide film on a conductive base member by immersing said conductive base member and a counter electrode in an aqueous solution having a surface and supplying a current between said conductive base member and said counter electrode, wherein end portions of said counter electrode opposed to regions of said conductive base member when the base member is positioned close to the surface of said solution and are folded by an angle of −1° to −90° with respect to said conductive base member.

9. An apparatus for forming a thin zinc oxide film according to claim 8, wherein said conductive base member is an elongated base member supported between a base member feeding roller and a base member wind-up roller and supplied into said aqueous solution.

10. An apparatus for forming a thin zinc oxide film according to claim 8, wherein a substance containing zinc as a main component is immersed in said aqueous solution.

11. An apparatus for forming a thin zinc oxide film according to claim 8, wherein a container housing said aqueous solution is provided with a device for maintaining a temperature of said solution at a constant value, a device for agitating or circulating said solution, and a device for maintaining a concentration of said solution at a constant value.

12. An apparatus for forming a thin zinc oxide film according to claim 8, wherein said aqueous solution contains at least zinc ions, nitrate ions and hydrocarbon.

13. An apparatus for forming a thin zinc oxide film according to claim 8, wherein a pH value of said aqueous solution is controlled within a range of 3 to 7.

14. A method of forming a thin zinc oxide film on a conductive base member by immersing said conductive base member and a single counter electrode in an aqueous solution having a surface and supplying a current between said conductive base member and said counter electrode, wherein a distance between said counter electrode and said base member is maintained at 50 mm or more at each end portion of said counter electrode opposed to regions of said conductive base member when the base member is positioned close to the surface of said solution, and at 3 mm to 40 mm at a central portion of said counter electrode.

15. A method of forming a thin zinc oxide film according to claim 14, wherein said end portions of said counter electrode are folded by an angle of −1° to −90° with respect to said conductive base member.

16. A method of forming a thin zinc oxide film according to claim 14, wherein said conductive base member is an elongated base member supported between a base member feeding roller and a base member wind-up roller and supplied into said aqueous solution.

17. A method of forming a thin zinc oxide film according to claim 14, wherein a substance containing zinc as a main component is immersed in said aqueous solution.

18. A method of forming a thin zinc oxide film according to claim 14, wherein a container housing said aqueous solution is provided with a device for maintaining a temperature of the solution at a constant value, a device for agitating or circulating the solution, and a device for maintaining a concentration of the solution at a constant value.

19. A method of forming a thin zinc oxide film according to claim 14, wherein said aqueous solution contains at least zinc ions, nitrate ions and hydrocarbon.

20. A method of forming a thin zinc oxide film according to claim 14, wherein a pH value of said aqueous solution is controlled within a range of 3 to 7.

21. A method of forming a thin zinc oxide film on a conductive base member by immersing said conductive base member and a counter electrode in an aqueous solution having a surface and supplying a current between said conductive base member and said counter electrode, wherein end portions of said counter electrode opposed to regions of said conductive base member when the base member is positioned close to the surface of said solution are folded by an angle of −1° to −90° with respect to said conductive base member.

22. A method of forming a thin zinc oxide film according to claim 21, wherein said conductive base member is an elongated base member supported between a base member feeding roller and a base member wind-up roller and supplied into said aqueous solution.

23. A method of forming a thin zinc oxide film according to claim 21, wherein a substance containing zinc as a main component is immersed in said aqueous solution.

24. A method of forming a thin zinc oxide film according to claim 21, wherein a container housing said aqueous solution is provided with a device for maintaining a temperature of the solution at a constant value, a device for agitating or circulating the solution, and a device for maintaining a concentration of the solution at a constant value.

25. A method of forming a thin zinc oxide film according to claim 21, wherein said aqueous solution contains at least zinc ions, nitrate ions and hydrocarbon.

26. A method of forming a thin zinc oxide film according to claim 21, wherein a pH value of said aqueous solution is controlled within a range of 3 to 7.

* * * * *

UNITED STATES PATENT AND TRADEMARK OFFICE
CERTIFICATE OF CORRECTION

PATENT NO.  : 6,224,736 B1
DATED       : May 1, 2001
INVENTOR(S) : Yusuke Miyamoto Page 1 of 1

It is certified that error appears in the above-identified patent and that said Letters Patent is hereby corrected as shown below:

Column 5,
Line 30, "proportional" should read -- proportion --; and
Line 57, "electrode the" should read -- electrode. The --.

Column 7,
Line 45, "referring to by" should read -- by referring to --.

Column 12,
Line 32, "was" should read -- were --.

Column 13,
Line 66, "and" should be deleted.

Signed and Sealed this

Fifth Day of March, 2002

Attest:

JAMES E. ROGAN
*Attesting Officer*  *Director of the United States Patent and Trademark Office*